United States Patent [19]
Hara et al.

[11] Patent Number: 5,126,595
[45] Date of Patent: Jun. 30, 1992

[54] BI-MOS SEMICONDUCTOR INTEGRATED CIRCUIT

[75] Inventors: Hiroyuki Hara, Fujisawa; Yasuhiro Sugimoto, Yokohama, both of Japan

[73] Assignee: Kabushiki Kaisha Toshiba, Kawasaki, Japan

[21] Appl. No.: 689,707

[22] Filed: Apr. 19, 1991

[30] Foreign Application Priority Data

Apr. 20, 1990 [JP] Japan .................................. 2-104579

[51] Int. Cl.$^5$ .......................................... H07K 19/003
[52] U.S. Cl. .................................... 307/446; 307/443; 307/570
[58] Field of Search ............... 307/443, 446, 570, 270, 307/296.2, 303.2

[56] References Cited

U.S. PATENT DOCUMENTS

| | | | |
|---|---|---|---|
| 4,694,203 | 9/1987 | Uragami et al. | 307/570 X |
| 4,703,203 | 10/1987 | Gallup et al. | 307/570 X |
| 4,769,561 | 9/1988 | Iwamura et al. | 307/443 X |
| 4,879,480 | 11/1989 | Suzuki et al. | 307/446 |
| 4,880,998 | 11/1989 | Ueda | 307/446 |
| 4,985,645 | 1/1991 | Tsutsui | 307/443 X |

Primary Examiner—David Hudspeth
Attorney, Agent, or Firm—Finnegan, Henderson, Farabow, Garrett and Dunner

[57] ABSTRACT

A P-channel MOSFET includes a gate for receiving an input signal, a source connected to a power supply terminal to which a high power supply voltage is applied, and a drain connected to the base of an NPN bipolar transistor at an output stage. The collector of the bipolar transistor is connected to the power supply terminal and the emitter thereof is connected to an output terminal. An N-channel MOSFET includes a gate for receiving the input signal, a drain connected to the output terminal, and a source and a back gate both connected to the base of an NPN bipolar transistor at the output stage. The collector of the bipolar transistor is connected to the output terminal, and the emitter thereof is connected to a power supply terminal to which a power supply voltage of ground potential is applied.

15 Claims, 3 Drawing Sheets

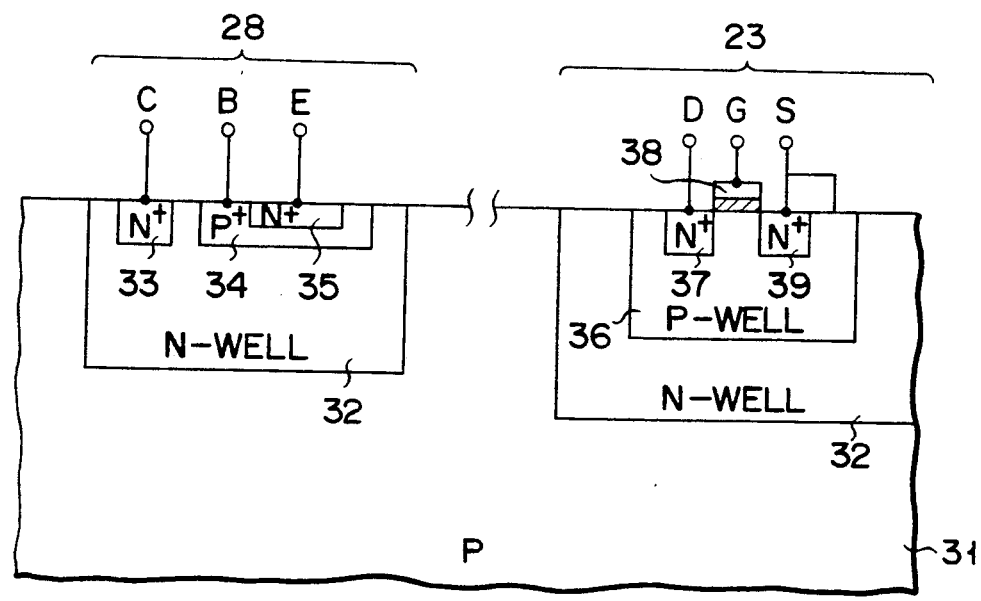
F I G. 3
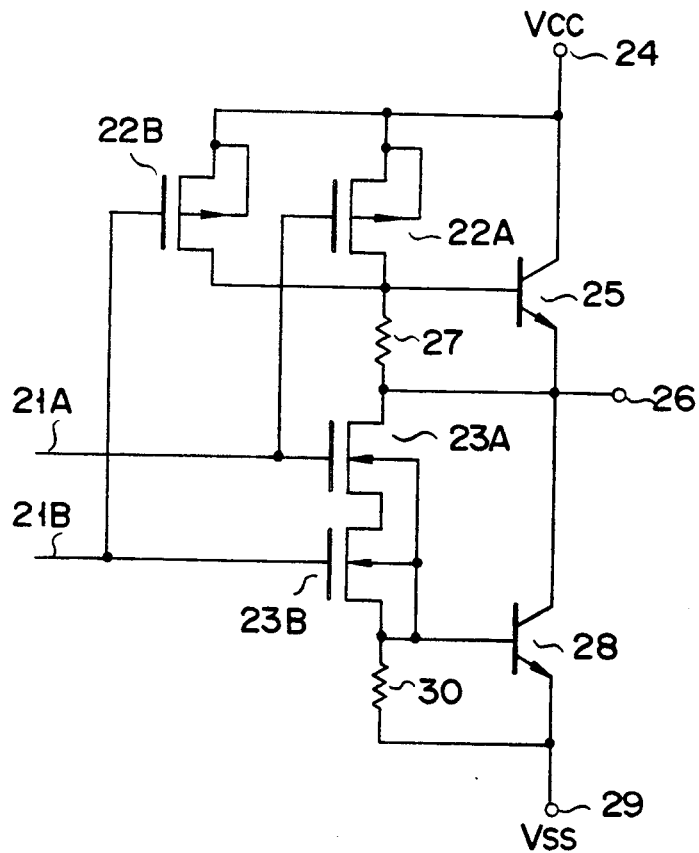
F I G. 4

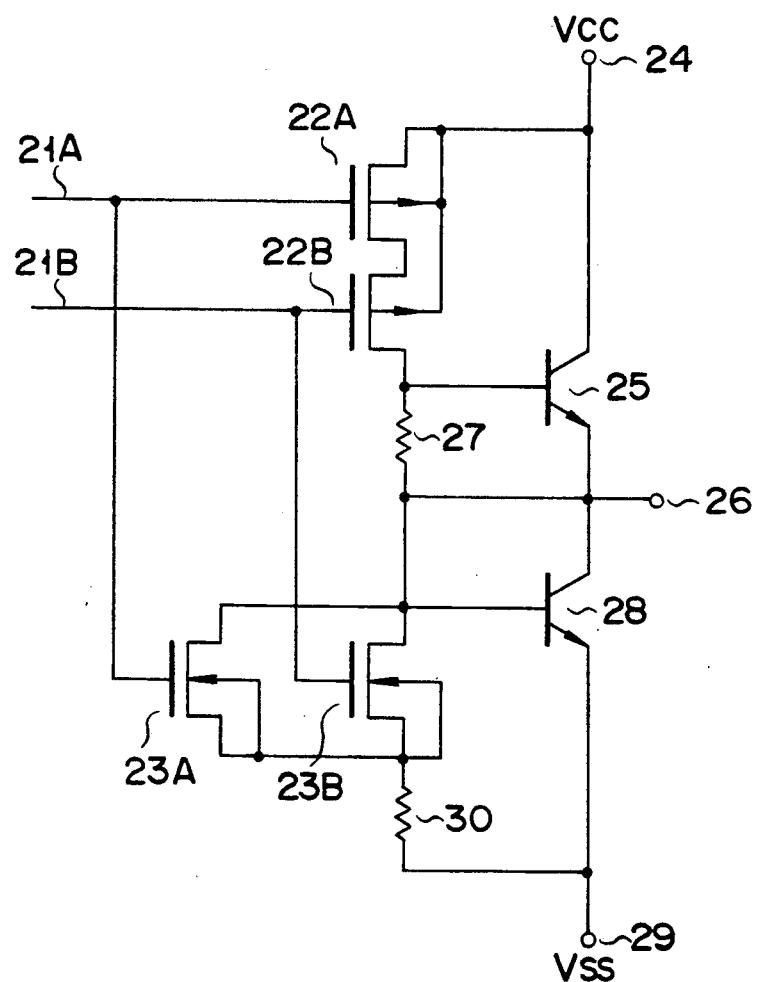
F I G. 5

BI-MOS SEMICONDUCTOR INTEGRATED CIRCUIT

BACKGROUND OF THE INVENTION

1. Field of the Invention

The present invention relates to a Bi-MOS semiconductor integrated circuit in which a bipolar transistor is formed at an output stage.

2. Description of the Related Art

FIG. 1 shows the structure of part of a conventional Bi-CMOS semiconductor integrated circuit in which a signal is processed by a logic circuit comprising P-and N-channel MOSFETs and a bipolar transistor is formed at an output stage to enhance the current driving force against an output load. In FIG. 1, reference numeral 11 denotes a signal output terminal, 12 shows a P-channel MOS FET for charging the output terminal 11 to be set at a high potential, 13 indicates an NPN bipolar transistor, formed at the output stage, for charging the output terminal 11 to be set at a high potential, 14 represents a resistor for emitting surplus base charges from the bipolar transistor 13 to increase the speed at which the on-state of the bipolar transistor 13 changes to the off-state thereof, 15 indicates an N-channel MOS FET for discharging the output terminal 11 to be set at a low potential, 16 shows an NPN bipolar transistor, formed at the output stage, for discharging the output terminal to be set at a low potential, 17 denotes a resistor for emitting surplus base charges from the bipolar transistor 16 to increase the speed at which the on-state of the bipolar transistor 16 changes to the off-state thereof, 18 indicates a power supply terminal to which a high power supply voltage $V_{cc}$ is applied, and 19 represents a power supply terminal to which a low power supply voltage $V_{ss}$ is applied.

In the conventional semiconductor integrated circuit described above, the back gate of the N-channel MOSFET 15 is connected to the power supply terminal 19 for the reason that an N-channel MOSFET is usually formed on the surface region of a P-type semiconductor substrate and the lowest voltage, that is, a low power supply voltage $V_{ss}$ is applied to the semiconductor substrate.

The source potential of the N-channel MOSFET 15 does not always correspond to the back gate potential thereof. If the back gate potential becomes lower than the source potential, the mutual conductance gm of the MOSFET is reduced by the well-known back gate bias effect.

The mutual conductance is reduced by the back gate bias effect particularly in a transition from the off-state of the MOSFET 15 to the on-state thereof. More specifically, if the MOSFET 15 is turned on, a base current flows into the bipolar transistor 16 through the MOSFET 15 and the bipolar transistor 16 is thus turned on. When the bipolar transistor 16 starts to be turned on, a voltage drop is caused in the parasitic base resistance of the transistor 16 and thus the source potential of the MOSFET 15 becomes higher than the power supply voltage $V_{ss}$. Since the back gate of the MOSFET 15 is always connected to the power supply terminal 19, the back gate potential of the MOSFET 15 is made lower than the source potential thereof by the voltage drop. The difference between the source potential and the back gate potential is considerably larger than a voltage (about 0.7 V) between the base and emitter of a common bipolar transistor. For example, the source potential of the MOSFET 15 increases up to about 2 V.

When a signal falls at the output terminal, the mutual conductance gm of the MOSFET 15 is greatly reduced, resulting in a problem wherein the base current of the bipolar transistor 16 reduces and the falling speed of the signal at the output terminal decreases.

SUMMARY OF THE OBJECT

It is accordingly an object of the present invention to provide a Bi-MOS semiconductor integrated circuit in which the falling speed of an output signal can be increased by mitigating the back gate bias effect of a MOSFET for driving the base of a bipolar transistor formed at an output stage.

According to the present invention, there is provided a Bi-MOS semiconductor integrated circuit comprising:
   a node for receiving an input signal;
   an output terminal for outputting a signal;
   a power supply terminal for receiving a power supply voltage;
   a bipolar transistor having a collector connected to the output terminal, an emitter connected to the power supply terminal, and a base; and
   a MOSFET having a gate connected to the node, a drain connected to the output terminal, a source and a back gate both connected to the base of the bipolar transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a cross-sectional view showing the structure of part of the circuit shown in FIG. 2;

FIG. 4 is a circuit diagram showing the structure of part of a Bi-CMOS semiconductor integrated circuit according to a second embodiment of the present invention; and FIG. 5 is a circuit diagram showing the structure of part of a Bi-CMOS semiconductor integrated circuit according to a third embodiment of the present invention.

DETAILED DESCRIPTION OF THE PREFERRED EMBODIMENTS

Embodiments of the present invention will be described with reference to the accompanying drawings.

Figure 1:
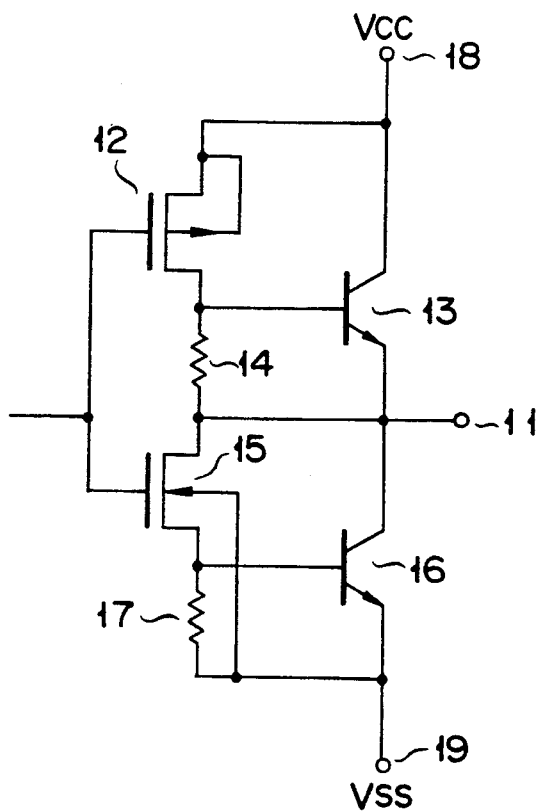
FIG. 1 is a circuit diagram showing the structure of part of a conventional Bi-CMOS semiconductor integrated circuit.
Figure 2:
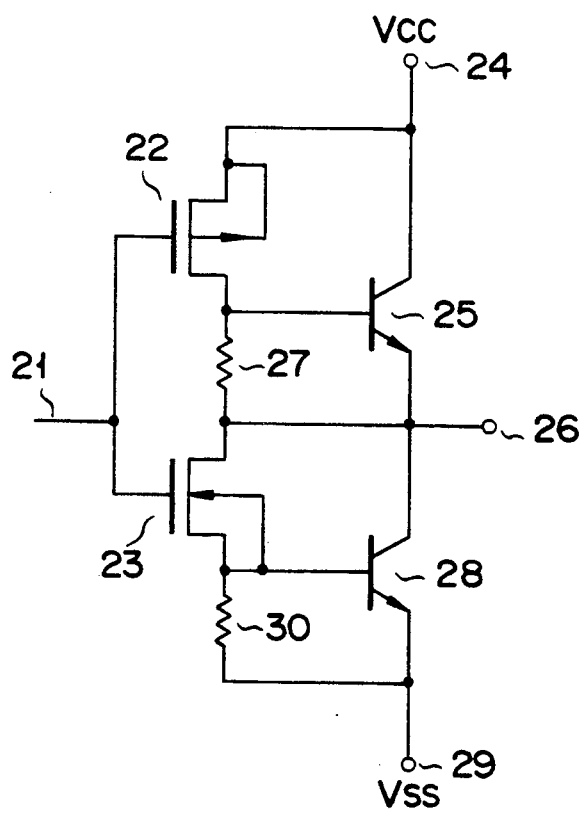
FIG. 2 is a circuit diagram showing the structure of part of a Bi-CMOS semiconductor integrated circuit according to a first embodiment of the present invention.

FIG. 2 illustrates the structure of part of a Bi-CMOS semiconductor integrated circuit according to the first embodiment of the present invention.

In FIG. 2, a node 21 is supplied with an input signal. The gates of P- and N-channel MOSFETs 22 and 23 are connected to the node 21. The source and back gate of the MOSFET 22 are connected to a power supply terminal 24 to which a high power supply voltage $V_{cc}$ is applied. The drain of the MOSFET 22 is connected to the base of an NPN bipolar transistor 25.

The collector of the bipolar transistor 25 is connected to the power supply terminal 24 and the emitter thereof is connected to an output terminal 26 for outputting a signal. Between the base of the bipolar transistor 25 and the output terminal 26, a resistor 27 is inserted to serve as a means for supplying surplus charges from the base to the output terminal 26 when the bipolar transistor 25 changes from the on-state to the off-state.

The drain of the N-channel MOSFET 23 is connected to the output terminal 26. The source and back gate of the MOSFET 23 are connected in common to the base of an NPN bipolar transistor 28. The collector of the bipolar transistor 28 is connected to the output terminal 26, the emitter thereof is connected to a power supply terminal 29 to which a power supply voltage $V_{ss}$ of ground potential is applied. Between the base of the bipolar transistor 28 and the power supply terminal 29, a resistor 30 is inserted to serve as a means for supplying surplus charges from the base to the power supply terminal 29 when the bipolar transistor 28 changes from the on-state to the off-state.

Assume that a signal at the node 21 is high in level ($V_{cc}$) and a signal at the output terminal 26 is low in level ($V_{ss}$). If the signal at the node 21 changes from the high level to the low level, the P-channel MOSFET 22 is rendered conductive. The output terminal 26 is thus charged with the voltage of the power supply terminal 24 through the conductive MOSFET 22 and resistor 27. If a base current is supplied through the MOSFET 22, the bipolar transistor 25 is rendered conductive and thus the output terminal 26 is charged. The signal at the output terminal 26 is therefore set to be high in level.

The signal at the node 21 is then changed from low level to high level. The conductive P-channel MOSFET 22 and bipolar transistor 25 are turned off, and the N-channel MOSFET 23 is turned on. Electric charges are emitted from the output terminal 26 whose signal level is high to the power supply terminal 29 through the MOSFET 23 and resistor 30. Further, since the base current is supplied through the MOSFET 23, the bipolar transistor 28 is turned on and the output terminal 26 is discharged.

If the MOSFET 23 and bipolar transistor 28 are rendered conductive, the surplus charges are emitted from the base of the bipolar transistor 25 and the speed at which the transistor 25 changes from the on-state to the off-state is increased.

As has been described in the Description of the Related Art, when the MOSFET 23 and bipolar transistor 28 start to be turned on, a relatively large base current flows and a relatively great voltage drop occurs in the parasitic base resistance of the transistor 28. In the circuit shown in FIG. 2, however, the back gate and source of the MOSFET 23 are connected in common to the base of the transistor 28 and thus the source potential and the back gate potential are always the same. For this reason, the reduction in mutual conductance due to the back gate bias effect, such as described in the Description of the Related Art, does not occur in the MOSFET 23. The circuit shown in FIG. 2 makes it possible to solve a problem in which the base current of the bipolar transistor 28 reduces when the signal at the output terminal 26 falls and the falling speed of the signal decreases.

As has been described in the Description of the Related Art, the back gate of an N-channel MOSFET is usually formed on the surface region of a P-type semiconductor substrate and a low power supply voltage $V_{ss}$ is always applied to the semiconductor substrate. If the N-channel MOSFET is formed on the P-type semiconductor substrate as it is, its back gate and source cannot be connected to each other.

FIG. 3 is a cross-sectional view showing the structure of part of the circuit shown in FIG. 2. As shown in FIG. 3, a plurality of N-well regions 32 is formed on a P-type semiconductor substrate 31 to attain the circuit shown in FIG. 2. An NPN bipolar transistor, which is to be provided at the output stage, is formed in one of the N-well regions 32. FIG. 3 illustrates the bipolar transistor 28 including a collector contact region 33, a base region 34 and an emitter region 35.

A plurality of P well regions 36 is formed in one of the N-well regions 32 (only one P-well region is shown in FIG. 3) and an N-channel MOSFET is formed in each of the P-well regions 36. FIG. 3 illustrates the MOSFET 23 including a drain region 37, a gate electrode 38 and a source region 39. Since the P-well regions 36 are formed independently of one another, each of them can be formed in contact with the source region 39.

The second embodiment of the present invention will be next described with reference to FIG. 4. In the second embodiment, the present invention is applied to a NAND logic circuit in which N (=positive integer) signals are input. Though N is two in this embodiment, three or more input signals can be used.

The circuit of the second embodiment differs from that of the first embodiment in that two nodes 21A and 21B supplied with an input signal are arranged in place of the node 21, two P-channel MOSFETs 22A and 22B are arranged in place of the P-channel MOSFET 22, and two N-channel MOSFETs 23A and 23B are arranged in place of the N-channel MOSFET 23.

The source-to-drain paths of the two P-channel MOSFETs 22A and 22B are connected in parallel between the $V_{cc}$ power supply terminal 24 and the base of the bipolar transistor 25 and the gates of the MOSFETs 22A and 22B are connected to the nodes 21A and 21B, respectively. The source-to-drain paths of the N-channel MOSFETs 23A and 23B are connected in series between the output terminal 26 and the base of the bipolar transistor 28 and the gates of the MOSFETs 23A and 23B are connected to the nodes 21A and 21B, respectively. The back gates of the N-channel MOSFETs 23A and 23B are connected to the source of the MOSFET 23B, the source being directly connected to the base of the bipolar transistor 28.

In the circuit so constructed, when both the signals at the nodes 21A and 21B are high in level the N-channel MOSFETs 23A and 23B are rendered conductive, the output terminal 26 is discharged and the output signal is set to be low in level. When both the signals at the nodes 21A and 21B are low in level, the P-channel MOSFETs 22A and 22B are rendered conductive, the output terminal 26 is charged and the output signal is set to be high in level. A NAND logic signal is thus output from the output terminal 26.

Even though a great voltage drop occurs in the parasitic base resistance of the bipolar transistor 28 when the N-channel MOSFETs 23A and 23B are turned on and the output terminal 26 starts to be charged, the source potential and the back gate potential are always the same since the source and the back gate of the MOSFET 23B are connected to each other. Therefore, the mutual conductance of the MOSFET 23B is not reduced by the back gate bias effect.

Since a voltage between the source and drain of the MOSFET 23B is slightly dropped after the MOSFET 23B is turned on, the source potential and back gate potential of the MOSFET 23A are virtually equal to each other. Thus, the mutual conductance of the MOSFET 23A is not reduced by the back gate bias effect.

In the circuit of the second embodiment, the back gate of the MOSFET 23A can be connected to the source of the MOSFET 23A instead of being connected to the source of the MOSFET 23B.

The third embodiment of the present invention will be described with reference to FIG. 5. In the third embodiment, the present invention is applied to a NOR logic circuit in which N (=positive integer) signals are input. Though N is two in this embodiment, three or more input signals can be used.

The circuit of the third embodiment differs from that of the second embodiment in the methods of connecting the two P-channel MOSFETs 22A and 22B and connecting the two N-channel MOSFETs 23A and 23B.

The source-to-drain paths of the P-channel MOSFETs 22A and 22B are connected in series between the $V_{cc}$ power supply terminal 24 and the base of the bipolar transistor 25. The source-to-drain paths of the N-channel MOSFETs 23A and 23B are connected in parallel between the output terminal 26 and the base of the bipolar transistor 28.

In the circuit so constructed, when at least one of the signals at the nodes 21A and 21B is high in level, one or both of the N-channel MOSFETs 23A and 23B are turned on, the output terminal 26 is discharged, and the output signal is set to be low in level. When the both of the signals at the nodes 21A and 21B is low in level, both of the P-channel MOSFETs 22A and 22B are turned on, the output terminal 26 is charged, and the output level is set to be high in level. A NOR logic signal is thus output from the output terminal 26.

Even though a great voltage drop occurs in the parasitic base resistance of the bipolar transistor 28 when one or both of the N-channel MOSFETs 23A and 23B are turned on and the output terminal 26 starts to be discharged, the source potential and the back gate potential are always the same since the source and the back gate of each of the MOSFETs 23A and 23B are connected to each other. Therefore, the mutual conductance of the MOSFETs 23A and 23B is not reduced by the back gate bias effect.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A bi-MOS semiconductor integrated circuit comprising:
   a first node for receiving an input signal;
   an output terminal for outputting a signal;
   a first power supply terminal for receiving a first power supply voltage;
   a first bipolar transistor having a collector connected to said output terminal, an emitter connected to said first power supply terminal, and a base; and
   a first MOSFET having a gate connected to said first node, a drain connected to said output terminal, a source and a back gate both connected to the base of said first bipolar transistor.

2. The Bi-MOS semiconductor integrated circuit according to claim 1, wherein said first bipolar transistor is of an NPN type, and said first MOSFET is of an N-channel type.

3. The Bi-MOS semiconductor integrated circuit according to claim 1, wherein a ground voltage is applied to said first power supply terminal as the first power supply voltage.

4. The Bi-MOS semiconductor integrated circuit according to claim 1, further comprising means, inserted between the base of said first bipolar transistor and said first power supply terminal, for extracting surplus charges from the base of said first bipolar transistor.

5. The Bi-MOS semiconductor integrated circuit according to claim 1, further comprising:
   a second power supply terminal for receiving a second power supply voltage;
   a second bipolar transistor having a collector connected to aid second power supply terminal, an emitter connected to said output terminal, and a base; and
   a second MOSFET having a gate connected to said first node, a source connected to said second power supply terminal, and a drain connected to the base of said second bipolar transistor.

6. The Bi-MOS semiconductor integrated circuit according to claim 5, wherein said second bipolar transistor is of an NPN type, and said second MOSFET is of an P-channel type.

7. The Bi-MOS semiconductor integrated circuit according to claim 5, wherein a high voltage is applied to said second power supply terminal as the second power supply voltage.

8. The Bi-MOS semiconductor integrated circuit according to claim 5, further comprising means, inserted between the base of said second bipolar transistor and said output terminal, for extracting surplus charges from the base of said second bipolar transistor.

9. A Bi-CMOS semiconductor integrated circuit comprising:
   N first nodes for receiving N input signals;
   an output terminal for outputting a signal;
   a first power supply terminal for receiving a first power supply voltage;
   a second power supply terminal for receiving a second power supply voltage;
   an NPN type first bipolar transistor having a collector connected to said output terminal, an emitter connected to said first power supply terminal, and a base;
   N N-channel MOSFETs each having a gate, a drain, a source, and a back gate, said gate being connected to a corresponding one of said N first nodes, drain-to-source paths of said N-channel MOSFETs being connected in series between said output terminal and the base of said first bipolar transistor, and said back gate being connected to at least said source which is connected to the base of said first bipolar transistor;

an NPN type second bipolar transistor having a collector connected to said second power supply terminal, an emitter connected to said output terminal, and a base; and N P-channel MOSFETs each having a gate, a drain, and a source, source-to-drain paths of said P-channel MOSFETs being connected in parallel between said second power supply terminal and said output terminal, and said gate being Connected to a corresponding one of said N first nodes.

10. The Bi-CMOS semiconductor integrated circuit according to claim 9, wherein a ground voltage is applied to said first power supply terminal as the first power supply voltage, and a high voltage is applied to said second power supply terminal as the second power supply voltage.

11. The Bi-CMOS semiconductor integrated circuit according to claim 9, wherein the back gates of said N N-channel MOSFETs are connected in common to the base of said first bipolar transistor.

12. The Bi-CMOS semiconductor integrated circuit according to claim 9, further comprising:

first means, inserted between the base of said first bipolar transistor and said first power supply terminal, for extracting surplus charges from the base of said first bipolar transistor; and second means, inserted between the base of said second bipolar transistor and said output terminal, for extracting surplus charges from the base of said second bipolar transistor.

13. A Bi-CMOS semiconductor integrated circuit comprising:

N first nodes for receiving N input signals;

an output terminal for outputting a signal;

a first power supply terminal for receiving a first power supply voltage;

a second power supply terminal for receiving a second power supply voltage;

an NPN type first bipolar transistor having a collector connected to said output terminal, an emitter connected to said first power supply terminal, and a base;

N N-channel MOSFETs each having a gate, a drain, a source, and a back gate, said gate being connected to a corresponding one of said N first nodes, drain-to-source paths of said N-channel MOSFETs being connected in parallel between said output terminal and the base of said first bipolar transistor, and said back gate being connected to said source;

an NPN type second bipolar transistor having a collector connected to said second power supply terminal, an emitter connected to said output terminal, and a base; and N P-channel MOSFETs each having a gate, a drain, and a source, source-to-drain paths of said P-channel MOSFETs being connected in series between said second power supply terminal and the base of said second bipolar transistor, and said gate being connected to a corresponding one of said N first nodes.

14. The Bi-CMOS semiconductor integrated circuit according to claim 13 wherein a ground voltage is applied to said first power supply terminal as the first power supply voltage, and a high voltage is applied to said second power supply terminal as the second power supply voltage.

15. The Bi-CMOS semiconductor integrated circuit according to claim 13, further comprising:

first means, inserted between the base of said first bipolar transistor and said first power supply terminal, for extracting surplus charges from the base of said first bipolar transistor; and second means, inserted between the base of said second bipolar transistor and said output terminal, for extracting surplus charges from the base of said second bipolar transistor.

* * * * *

UNITED STATES PATENT AND TRADEMARK OFFICE
CERTIFICATE OF CORRECTION

PATENT NO. : 5,126,595
DATED : June 30, 1992
INVENTOR(S) : Hiroyuki Hara et al.

It is certified that error appears in the above-identified patent and that said Letters Patent is hereby corrected as shown below:

Claim 1, column 6, line 1, change "bi-MOS" to --Bi-MOS.

Claim 5, column 6, line 33, change "aid" to --said--.

Claim 6, column 6, line 43, change "an" to --a--.

Claim 9, column 7, line 14, change "Connected" to --connected--.

Signed and Sealed this

Ninth Day of November, 1993

*Attest:*

BRUCE LEHMAN

*Attesting Officer*     *Commissioner of Patents and Trademarks*